(12) United States Patent
Cernea

(10) Patent No.: US 6,845,045 B1
(45) Date of Patent: *Jan. 18, 2005

(54) BACKGROUND OPERATION FOR MEMORY CELLS

(75) Inventor: Raul Adrian Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/677,349

(22) Filed: Oct. 1, 2003

Related U.S. Application Data

(63) Continuation of application No. 09/956,201, filed on Sep. 17, 2001, now Pat. No. 6,741,502.

(51) Int. Cl.⁷ .............................................. G11C 16/04
(52) U.S. Cl. .............................. 365/185.29; 365/185.11; 365/185.18
(58) Field of Search ....................... 365/185.29, 185.11, 365/185.18

(56) References Cited

U.S. PATENT DOCUMENTS

| | | | |
|---|---|---|---|
| 5,095,344 A | 3/1992 | Harari | |
| 5,172,338 A | 12/1992 | Mehrotra et al. | |
| 5,270,979 A | 12/1993 | Harari et al. | |
| 5,380,672 A | 1/1995 | Yuan et al. | |
| 5,602,987 A | 2/1997 | Harari et al. | |
| 5,642,312 A | 6/1997 | Harari | |
| 5,949,716 A | 9/1999 | Wong et al. | |
| 5,959,887 A | 9/1999 | Takashina et al. | |
| 6,014,755 A | 1/2000 | Wells et al. | |
| 6,088,264 A * | 7/2000 | Hazen et al. | 365/185.11 |
| 6,091,633 A * | 7/2000 | Cernea et al. | 365/185.13 |
| 6,222,762 B1 | 4/2001 | Guterman et al. | |
| 6,230,233 B1 | 5/2001 | Lofgren et al. | |
| 6,434,049 B1 * | 8/2002 | Trivedi et al. | 365/185.2 |

FOREIGN PATENT DOCUMENTS

EP 0843316 A 5/1998

* cited by examiner

Primary Examiner—Michael S. Lebentritt
Assistant Examiner—J. H. Hur
(74) Attorney, Agent, or Firm—Parsons Hsue & de Runtz LLP

(57) ABSTRACT

A technique to perform an operation (e.g., erase, program, or read) on memory cells (105) is to apply an operating voltage dynamically to the gates (111, 113) of the memory cells, rather than a continuous operating voltage. This reduces the power consumed during the operation. Dynamic operation or background operation such as background erase also permits other operations, such as read, program, or erase to occur while the selected memory cells are operated on. This improves the operational speed of an integrated circuit using dynamic operation compared to a continuous operation. A transfer transistor controls coupling of the operating voltage to a node of the memory cells selected for dynamic operation. When the node is substantially charged to the operating voltage it is floated by turning off the transfer transistor. The dynamically held operating voltage is allowed to perform the memory operation with the occasional refresh.

25 Claims, 4 Drawing Sheets

BACKGROUND OPERATION FOR MEMORY CELLS

CROSS-REFERENCE TO RELATED APPLICATION

This application is a continuation of application Ser. No. 09/956,201, filed Sep. 17, 2001, now U.S. Pat. No. 6,741,502 which application is incorporated herein in its entirety by this reference.

BACKGROUND OF THE INVENTION

The present invention relates to nonvolatile erasable programmable memories and more specifically, techniques for erasing, programming, or reading these types of memories.

Memory and storage is one of the key technology areas that is enabling the growth in the information age. With the rapid growth in the Internet, World Wide Web (WWW), wireless phones, personal digital assistant, digital cameras, digital camcorders, digital music players, computers, networks, and more, there is continually a need for better memory and storage technology. A particular type of memory is nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include CompactFlash (CF) cards, MultiMedia cards (MMC), Flash PC cards (e.g., ATA Flash cards), SmartMedia cards, and memory sticks.

A widely used type of semiconductor memory storage cell is the floating gate memory cell. Some types of floating gate memory cells include Flash, EEPROM, and EPROM. The memory cells are configured or programmed to a desired configured state. In particular, electric charge is placed on or removed from the floating gate of a Flash memory cell to put the memory into two or more stored states. One state is an erased state and there may be one or more programmed states. Alternatively, depending on the technology and terminology, there may be a programmed state and one or more erased states. A Flash memory cell can be used to represent at least two binary states, a 0 or a 1. A Flash memory cell can store more than two binary states, such as a 00, 01, 10, or 11; this cell can store multiple states and may be referred to as a multistate memory cell. The cell may have more than one programmed states. If one state is the erased state (00), the programmed states will be 01, 10, and 11, although the actual encoding of the states may vary.

Despite the success of nonvolatile memories, there also continues to be a need to improve the technology. It is desirable to improve the density, speed, durability, and reliability of these memories. It is also desirable to reduce power consumption.

As can be seen, there is a need for improving the operation of nonvolatile memories. Specifically, by allowing background operation of the nonvolatile memory cells, this will speed up operations and reduce power consumption.

SUMMARY OF THE INVENTION

The invention provides a technique of erasing, programming, or reading nonvolatile memory cells by dynamically applying an operating voltage to the gates of the memory cells, rather than a continuous voltage. This reduces the power consumed during an operation. Dynamic operation such as dynamic erase, dynamic program, dynamic read, also permits any operation, such as read, program, or erase, to occur while selected memory cells are activated. Dynamic operation improves the operational speed of an integrated circuit compared to a continuous operation. This technique may also be referred to as background operation, such as background erase, background program, or background read. In an embodiment, the gates are charged to an operational or operating voltage using a charge pump. The operational voltage may be an erase voltage, program voltage, or read voltage. The pump is then disconnected, and the gates remain at the voltage dynamically. The operating voltage at the gates will be periodically checked and refreshed as needed. While the charge pump is disconnected and the operating voltage is dynamically held at the gates, other operations, possibly on other memory cells, may be performed.

In one embodiment, the invention is a method of operating an integrated circuit with nonvolatile memory cells including turning on a charge pump to generate an erase voltage. One or more erase gates of nonvolatile memory cells selected for erase are charged with the erase voltage. The charge pump is disconnected. The charge pump may also be turned off after it is disconnected. The erase gates are allowed to hold the erase voltage dynamically while the charge pump is disconnected. The selected nonvolatile memory cells are erased using the dynamic erase voltage.

The charge pump may be periodically connected to refresh the erase voltage on the erase gates to refresh the erase voltage on the erase gates. Programming of nonvolatile memory cells, other than the nonvolatile memory cells selected for erase, is permitted while the charge pump is disconnected. Reading of nonvolatile memory cells, other than the nonvolatile memory cells selected for erase, is permitted while the charge pump is disconnected.

The selected nonvolatile memory cells may be checked to see whether they are erased. If the selected nonvolatile memory cells are not erased, the charge pump is connected to refresh the erase voltage on the erase gates. The operation may be repeated.

In another embodiment, the invention is a method of operating an integrated circuit including erasing, programming, or reading selected memory cells by dynamically charging gates of the selected memory cells by periodically directly applying an operational voltage to the gates. Operations on memory cells, other than the selected memory cells, are permitted when the operating voltage is not being directly applied to the gates. When the selected memory cells are considered erased, programmed, or read, the gates of the selected memory cells are discharged to ground. When the selected memory cells are erased, a VT of a floating gate transistor becomes uniformly positive or negative.

In another embodiment, the invention is an integrated circuit including an array of memory cells arranged in rows and columns. There are a number of transfer transistors, each connected to a row of the array of memory cells. There are a number of pumps, each connected to one of the transfer transistors. A pump dynamically charges gates of a row of memory cells to an operating voltage through a respective transfer transistor and the operating voltage is dynamically held at the gates by turning off the respective transfer transistor.

Other objects, features, and advantages of the present invention will become apparent upon consideration of the following detailed description and the accompanying drawings, in which like reference designations represent like features throughout the figures.

DETAILED DESCRIPTION

Integrated circuits providing nonvolatile storage include nonvolatile erasable-programmable memory cells. Many types of integrated circuits having nonvolatile memory cells include memories, microcontrollers, microprocessors, and programmable logic. Nonvolatile memory integrated circuits may be combined with other nonvolatile memory integrated circuits to form larger memories. The nonvolatile memory integrated circuits may also be combined with other integrated circuits or components such as controllers, microprocessors, random access memories (RAM), or I/O devices, to form a nonvolatile memory system. An example of a Flash EEPROM system is discussed in U.S. Pat. No. 5,602,987, which is incorporated by reference along with all references cited in this application. Further discussion of nonvolatile cells and storage is in U.S. Pat. Nos. 5,095,344, 5,270,979, 5,380,672, 6,222,762, and 6,230,233 which are incorporated by reference.

Figure 1:
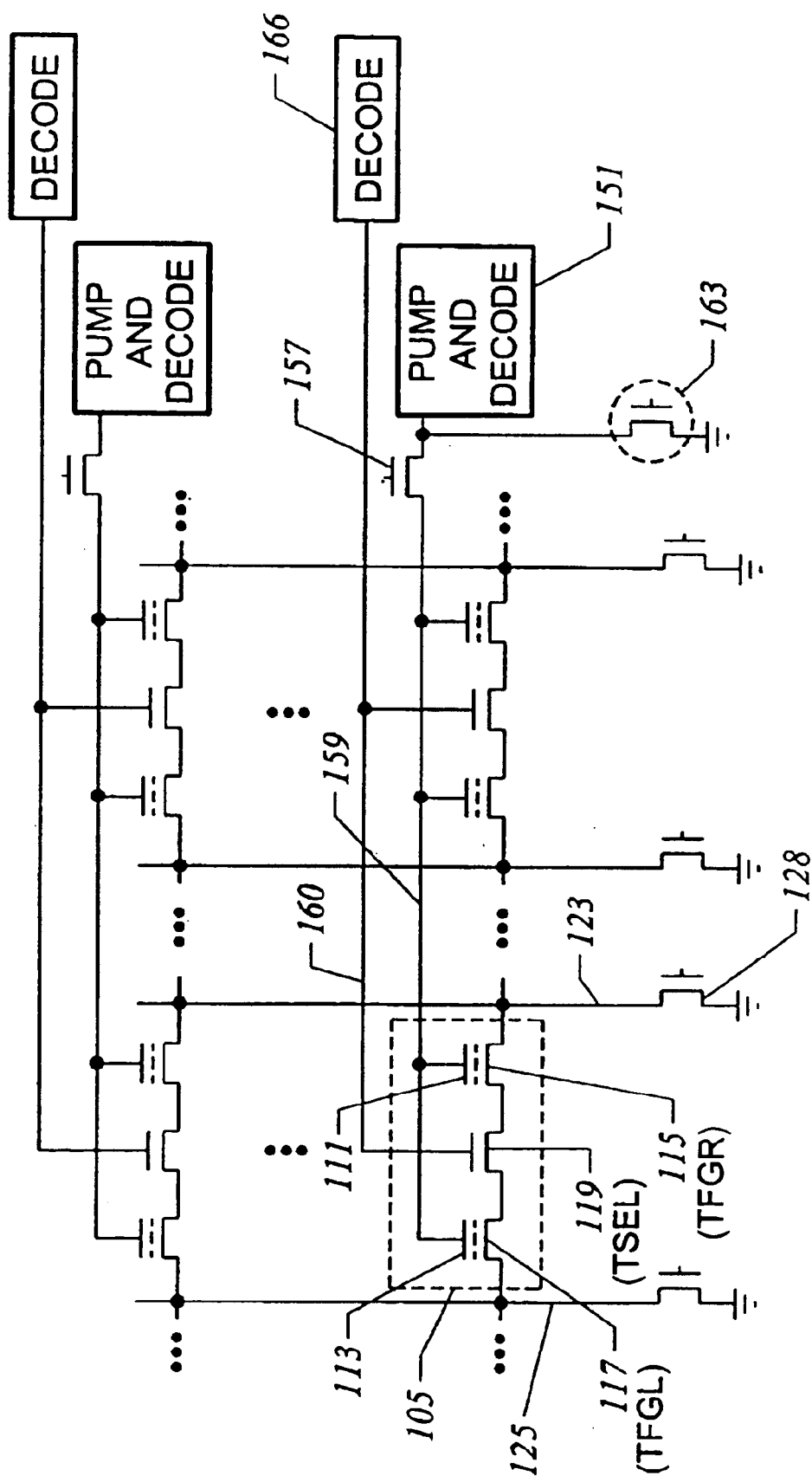
FIG. 1 shows an array of memory cells and circuitry for operating the memory cells.

Some types of nonvolatile storage or memory cell are Flash, EEPROM, and EPROM. The invention also applied to other types of memories such as phase-change memories, NRAM, FRAM, magnetic ferroelectric, and many others. The memory cells are generally arranged within the integrated circuit in an array of rows and columns. FIG. 1 shows an array of Flash memory cells 105. Details of the interconnections of the memory cells are not shown in the figure in order to simplify the diagram. There are many different types and configurations of memory cells. Memory cell 105 is a multibit cell that is described in more detail in U.S. Pat. No. 5,712,180, which is incorporated by reference. This memory cell has a select or select gate line 160, a right control gate or erase gate 111, and a left control gate or erase gate 113. The right control gate is a control electrode of a right floating gate transistor (TFGR) 115, and the left control gate line is a control electrode of a left floating gate transistor (TFGL) 117. The right and left control gates are connected to an erase gate line 159. The select gate line is connected to a gate of a select transistor (TSEL) 119. A decoder 166 is connected to the select gate lines. the select gate lines and corresponding select gates for a row may be enabled or disabled by row using the decoder.

For each memory cell 105, there are two floating gate transistors or cells 115 and 117 to store binary data. Each of these floating gate transistors may store a single bit or multiple bits of data. When storing multiple bits of data, each floating gate cell may also be referred to as a multilevel or multibit cell, because the cell may be programmed to have more than two VT (threshold voltage) levels. For example, each floating gate transistor may store two bits per cell, four bits per cell, or an even greater number of bits per cell.

Floating gate transistors are selectively configured by placing appropriate voltages on drain or source lines 123 and 125, control gate lines 113 and 111, and select lines 160. For example, drain or source line 123 may be selectively grounded by using a transistor 128.

Figures 4, 5:
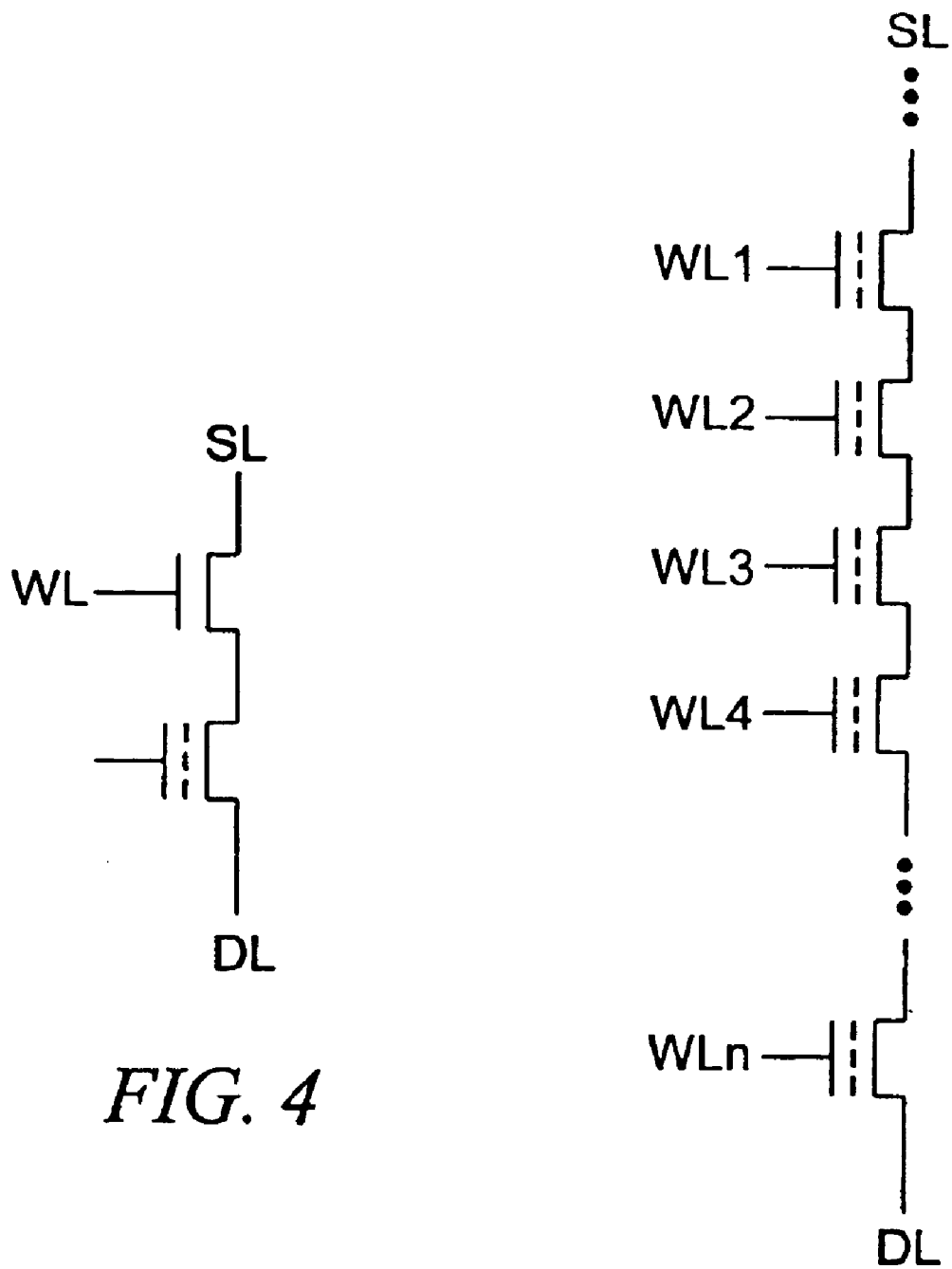
FIG. 4 shows a diagram of a NOR Flash cell.
FIG. 5 shows a diagram of some NAND Flash cells.

The invention will be described with respect to the specific memory cell structure shown in FIG. 1, where there are two floating gate transistors per cell. However, the invention is also applicable to other memory cell structures. For example, the invention may be used for memory cells where there is a single floating gate transistor per cell. In another embodiment, there may be a single floating gate transistor and a single select transistor in each cell. The invention is applicable to memory cells organized in NOR or NAND arrangements. FIG. 4 shows an example of a NOR cell while FIG. 5 shows an example of a NAND cell.

In an embodiment, the invention provides a technique of dynamically applying a voltage to a portion of the memory cells and allowing another operation on other memory cells. By applying a dynamic voltage to some memory cells, this allows a dynamic operation to occur on the selected memory cells. This dynamic operation may be, for example, a dynamic erase, dynamic program, or dynamic read.

In particular, one operation on the memory cells is to place selected floating gate transistors into an erased state. This discussion focuses on dynamic erase, but it is understood that the invention applies analogously to any other dynamic operations including dynamic program and dynamic read. Erase refers to configuring each of the selected floating gate devices to have a VT (threshold voltage) of, for example, below 0 volts. When erased, the floating gate transistor does conduct current even when 1 volt is placed on its gate.

One technique of erasing the selected memory cells involves connecting the erase gate line 159, which is connected to the erase gate of the memory cells, to an erase voltage. The erase voltage is typically a high voltage, which may be above 15 volts. The erase voltage may be from about 15 volts to about 22 volts. The erase voltage may be generated using an on-chip high voltage pump, also known as a charge pump. In other embodiments, the erase voltage may be supplied from an off-chip source to a pin of the integrated circuit.

The erase gates of the memory cells to be erased are continuously driven with the erase voltage until the memory cells are erased. The memory cells are erased when the VTs of the floating gate devices are set to about 0 volts or less. Typically, a relatively large number of memory cells are erased at one time. For example, in a solid state disk, such a Flash card, erase may be performed on a group of cells referred to as a sector. Memory arrays or cells may be erased one row or one column at a time. Or, all the memory cells of the integrated circuit may be bulk erased at the same time.

In one embodiment, the memory cells are initialized to an erased state before they can be placed into a programmed state. The technique of erasing memory cells by continuously driving the select gate has drawbacks. The erase operation typically occurs in 100s of microseconds or even milliseconds. Reading (or sensing) the state of the memory cells typically takes microseconds. Programming the memory cells typically takes in the 10s of microseconds. And, turning the erase pump or charge pump on takes some time in the 1 microsecond to 5 microseconds range.

When erasing by continuously driving the erase gates, the erase pump is turned on and generally consumes power: capacitors of the erase pump are driven using a high-voltage clock oscillator which consumes power. Power consumption of an integrated circuit during an erase mode is typically in the 10s of milliamps. The erase cycle is the entire time period (e.g., 100s of microseconds) from the start of applying the erase voltage to the erase gates until the floating gate devices are erased. During the erase operation, there are no other operations that occur during the entire erase cycle. One of the reasons other operations are not performed during the erase mode is that it is not desirable to further increase the power consumption during the erase mode. Another reason is that certain circuits such as the programming circuitry cannot perform or accomplish dual tasks.

Furthermore, there may be reliability issues when erasing by continuous erase voltage drive. When in a multiple-sector erase mode, all sectors are erased at the same (i.e., highest) voltage that might be required by the hardest to erase sector, thus unnecessarily stressing the faster ones. This may lead to a situation where some memory cells are overerased (i.e., erased to a VT lower than necessary), which puts extra stress on these floating gates. This may lead to a decreased longevity of the overstressed floating gate devices. Therefore, in order to prevent overerase, only certain patterns of multiple sector erase may be available. During the whole erase operation the erase clock and the erase pump are on, burning current. In case of power failure, the sector status (e.g., whether a sector is completely erased) remains uncertain, depending on the time the crash occurred. When the memory chip is in the erase mode, generally other types of operation are not possible.

Figure 2:
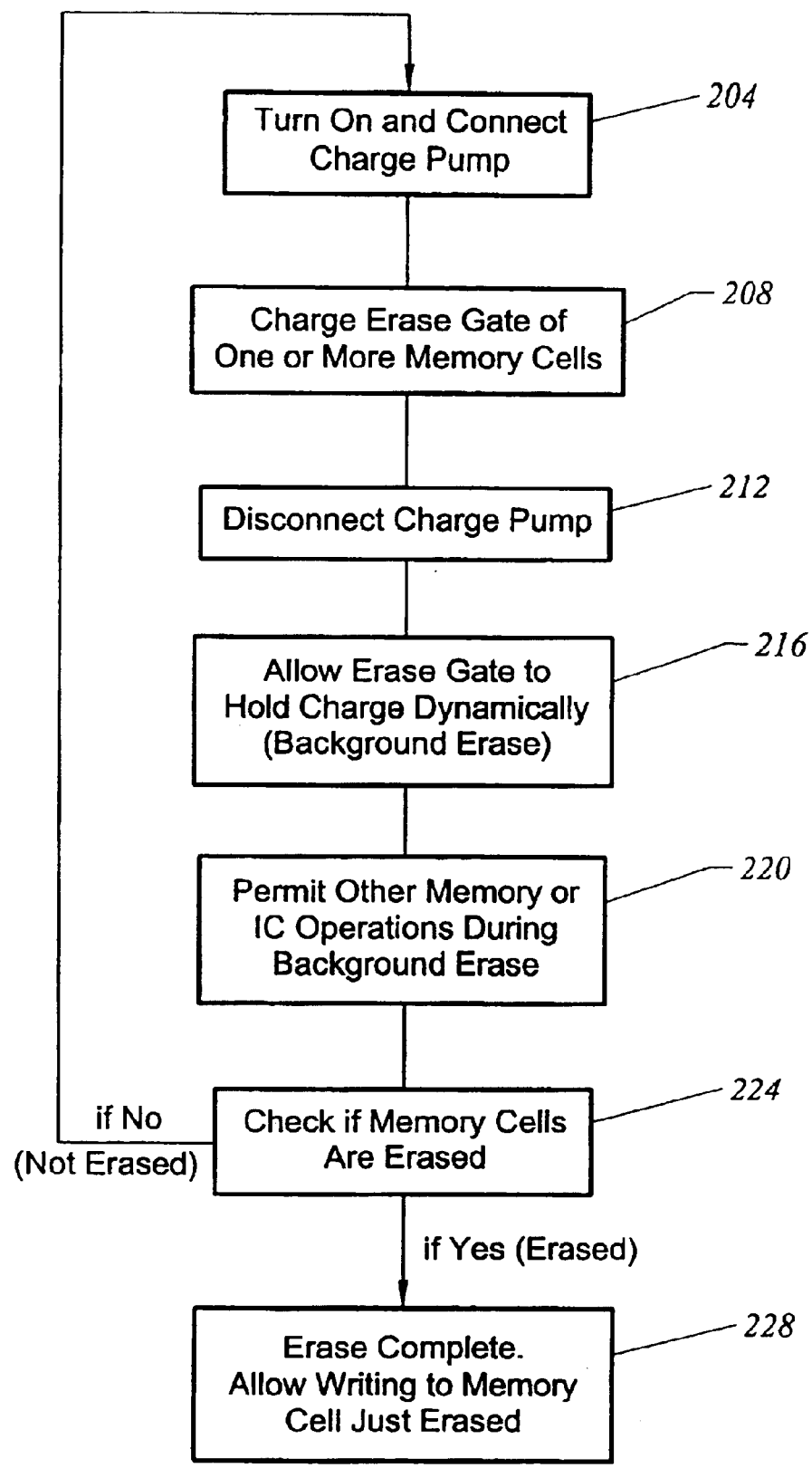
FIG. 2 shows a flow diagram for dynamically erasing memory cells

A proposed technique of erasing memory cells is to apply the erase voltage dynamically to the control gate (also may be referenced to as erase gate) of the selected memory cells. The technique may be referred to as dynamic erase, latched erase, or background erase. FIG. 2 shows a flow diagram of the dynamic erase technique. Flow diagrams for other dynamic operations (e.g., dynamic program, dynamic read) would be similar. In particular, dynamic erase involves erasing memory cells by turning on the charge pump (box 204). For example, in FIG. 1, a selected erase pump 151 (may also be referred to as erase and decode circuitry) may be turned on or connecting and applied to the selected memory cells. The erase voltage may be selectively applied to the selected erase line using decoding circuitry. The details of the decoder circuitry are not shown, but any typical decoder circuitry may be utilized. Decoder circuitry may include pass transistors and logic gates.

A transfer transistor 157 between the erase pump and the memory cells may be part of the decode or predecode circuitry, and it may be itself connected to an erase pump. Transistor 157 is turned on in order to connect the erase voltage of the erase pump to the erase gates. In order to pass a high voltage from the erase pump through the transfer transistor to the erase line with erase gates, the gate of the transistor need to be at the high voltage level (i.e., erase voltage) plus a VT of the transfer transistor.

The erase gates are charged to the erase voltage (box 208). The erase pump is turned off after gates are charged (box 212) and transistor 157 is turned off. Since there is parasitic capacitance on the erase line 159 (may also be called the word line) connecting the erase (select) transistors, the erase voltage will be held at the erase gates (box 216). Depending on the amount of capacitance, which is generally fairly large (in the picofarad range), the charge on line 159 will decay very gradually, mainly due to charge transfer to the floating gate. During the period when line 159 is charged, the memory cells will be dynamically erased by the dynamic erase voltage. While the erase pump is disconnected or off, other operations may be performed (box 220). For example, other memory cells may be programmed or sensed and read.

The dynamic operation of the memory cells may have a duration depending on on-chip logic, off-chip logic, on-chip timer, off-chip timer, or other circuitry. For example, after some time, the memory cells will be checked if they have been erased or not (box 224). This check may be performed using the sense amplifier circuitry or other on-chip intelligence. Alternatively, the memory cells may be checked by an external circuit, such as a controller integrated circuit. If not erased, the dynamic erase operation occurs again (boxes 204, 208, 212, 216, 220, and 224). The erase voltage may be refreshed to the full erase voltage level (box 216). The erase voltage will be gradually discharged by the equivalent of small currents per erase gate, consumed by the erase operation of removing of electrons from the floating gates. The dynamic erase operation continues until the selected memory cells erased (box 228). The erased memory cells may now be written (or programmed).

By using a dynamic mode of operation, the above problems described with continuous erase voltage drive are solved. Because inherently, the erase line has a capacitance (which at least in part is parasitic capacitance), the erase gate can be first, actively, brought to the desired voltage, which may be digital-to-analog-converter (DAC) controlled. Then, the transfer gate (transistor 157) that was driving it is turned off. Charge remains trapped on the erase line until later when the transfer gate is turned on again, at which point the erase gate is either refreshed or actively discharged to ground.

There are many ways the erase line may be actively discharged to ground. The circuitry may be part of pump and decode circuitry 151. FIG. 1 shows an example of one embodiment. A discharge transistor 163 is connected between the erase line and ground. The discharge transistor may be connected on either side of transistor 157, either on the side of the pump or on the side of the erase gates. In FIG. 1, transistor 163 is connected to the pump side of the transistor 157. This discharge transistor is turned on to discharge the erase line after the memory cells are erased.

By using dynamic erase, any combination or pattern of erase gates can be latched into virtually simultaneous erase. Erase gates may be charged to different erase voltage levels, depending upon their particular needs, which helps prevent overstress. After latching one or more of the erase gates into erase operation, the chip itself can perform any other operation (e.g., read, write, or erase). For example, dynamic erase may be occurring from two or more erase lines at the same time. However, the particular segment where erase is dynamically occurring should be left isolated. Furthermore, dynamic erase may be performed on the erase lines in any desired pattern. For example, alternating rows of memory cells may be erased. The erase clock and the erase pump can be nonactive during most of the erase operation period, saving current. If power failure happens, it does not affect the trapped charge, so only a relatively longer erase will take place.

Furthermore, as discussed above, the erase operation takes a relatively long time compared to other operations such as read or write operation. An integrated circuit using the background feature will operate faster. In other words, many more operations may be done on the integrated circuit with background erase in the same amount of time than compared to an integrated circuit with continuous erase. As an example, a read operation may take about 2 microseconds, an erase operation may take more than about 100 microseconds, and a program operation may take about 10 microseconds. The read operation is about fifty or more times faster than the erase operation. Therefore, fifty or more read operations may occur at the same time as the dynamic erase operation. The program operation is about ten or more times faster than the erase operation. Therefore, ten or more program operations may occur at the same time as the dynamic erase operation.

Because the actual voltage on the erase gate decays over time due to Fowler-Nordheim tunneling to the floating gates or junction leakage, refreshing operations can bring it back to the desired level or an overdrive value can be used instead. An overdrive value may be about 0.5 volts higher than the regular value.

The circuitry to implement dynamic erase operation is much the same as the circuitry used for continuous or static erase operation. Therefore, there is no die size penalty. Furthermore, if for some reason, possibly due to process variations, this mode of operation turns out to be unsatisfactory, normal erase using a continuous or static erase voltage may still be used for those integrated circuits. The integrated circuits where dynamic operation is not functionally because of process or other variations can still be packaged and sold.

Figure 3:
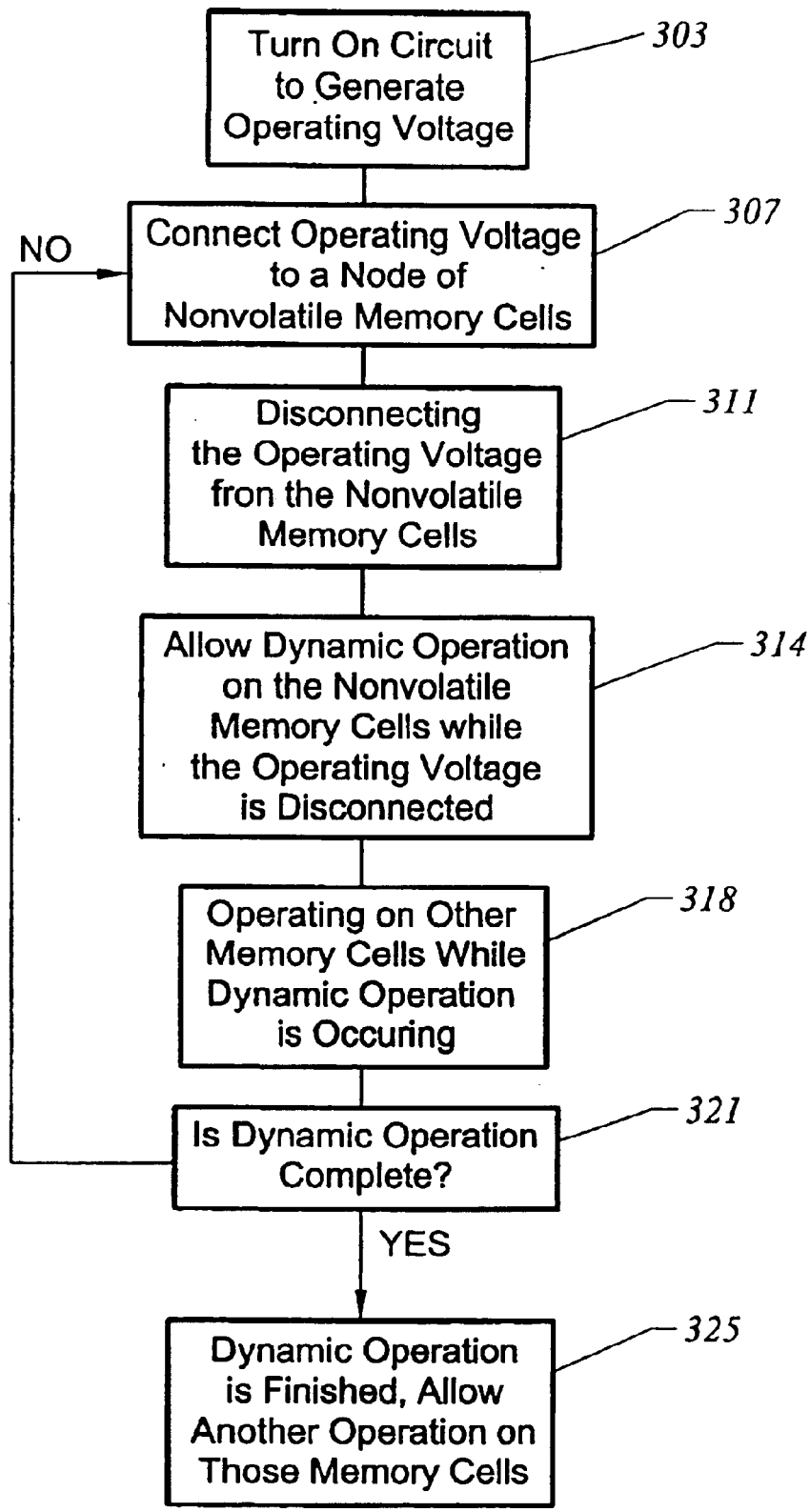
FIG. 3 shows a flow diagram for dynamically operating on memory cells.

FIG. 3 shows an alternative embodiment of the invention, where the dynamic or background operation is not specifically the erase operation. First, the circuitry to generate a required operating voltage is turned on (box 303). The circuitry may be on-chip or off-chip. This circuitry may be, for example, a charge pump, high-voltage switch, or a basic logic gate to output a logic high or logic low.

Next, the operating voltage is connected to one or more nodes of one or more nonvolatile memory cells (box 307). The connection may be, for example, by way of a transfer or pass transistor or logic gate. The node of the memory cell may be the drain, source, gate, erase gate, tunnel node, or any other node or nodes. The node is charged to the operating voltage and this voltage is held there dynamically by capacitance including parasitic capacitance. The operating voltage is disconnected from the memory cells (box 311).

The dynamic operation occurs to the memory cells (box 314). The dynamic operation may be erase, program, or read. While the dynamic operation occurs, other memory cells (not operated on dynamically) may be operated on (box 318). For example, while some memory cells are being dynamically programmed, other memory cells may be read. Or, interleaved program, erase, or read may occur where dynamic operation is occurring on two portions of memory cells, at slightly different starting times. Any combination of different operations may occur as long as that combination does not disturb or interfere with the dynamic operations.

The dynamic operation is checked whether it is complete (box 321). If yes, the operation is finished (box 325) and other operations may occur on the memory cells just dynamically operated on. Otherwise the dynamic operation occurs again (boxes 307, 311, 314, 318, and 321) until complete. The circuitry used to detect completion of the dynamic operation may be on-chip, off-chip, and use sense amplifier or timer circuit.

FIG. 4 shows a nonvolatile memory cell for a NOR configuration.

FIG. 5 shows nonvolatile memory cells in a NAND configuration.

In FIGS. 4 and 5, the nonvolatile memory cells are floating gate devices such as Flash, EEPROM, or EPROM.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of operating an integrated circuit with nonvolatile memory cells comprising:
   generating from a power source an operating voltage for a memory operation;
   connecting said power source to nonvolatile memory cells selected for said memory operation via a node of nonvolatile memory cells;
   floating said node after it has been charged substantially to said operating voltage; and
   allowing said node to hold said operating voltage dynamically while performing said memory operation dynamically on the selected nonvolatile memory cells.

2. The method of claim 1, further comprising: periodically reconnecting said power source to said node to refresh the voltage on said node until the memory operation is completed.

3. The method of claim 2, wherein
   said nonvolatile memory cells are organized in an array accessible by word lines and bit lines; and
   said node is connected to a word line.

4. The method of claim 1, further comprising:
   permitting another memory operation on nonvolatile memory cells, other than the nonvolatile memory cells selected for dynamic operation.

5. The method of claim 4, wherein said another memory operation includes:
   programming of nonvolatile memory cells, other than the nonvolatile memory cells selected for dynamic operation.

6. The method of claim 4, wherein said another memory operation includes:
   reading of nonvolatile memory cells, other than the nonvolatile memory cells selected for dynamic operation.

7. The method of claim 1, wherein each nonvolatile memory cell comprises one charge storage element.

8. The method of claim 1, wherein each nonvolatile memory cell comprises more than one charge storage element.

9. The method of claim 1 further comprising:
   permitting other operations within the integrated circuit, other than operations on the nonvolatile memory cells selected for dynamic operation.

10. The method of claim 1, further comprising:
    checking at predetermined times whether the selected nonvolatile memory cells have completed said dynamic memory operation; and
    if the selected nonvolatile memory cells have not completed said dynamic memory operation, reconnecting said power source to refresh the voltage on said node.

11. The method of claim 10, further comprising:
    after the selected nonvolatile memory cells have completed the dynamic memory operation, discharging said node to a predetermined voltage level.

12. A method of operating an integrated circuit comprising:
    connecting an operating voltage to a first portion of nonvolatile memory cells;
    charging a node of the first portion of nonvolatile memory cells to the operating voltage;

floating the node of the first portion of the memory cells to hold the operating voltage dynamically; and operating on the first portion of nonvolatile memory cells dynamically.

13. The method of claim 12 further comprising:

while the first portion of nonvolatile memory cells is dynamically being operated on, permitting operation on a second portion of nonvolatile memory cells.

14. The method of any one of claims 1–13, wherein each nonvolatile memory cell stores one bit of data.

15. The method of any one of claims 1–13, wherein each nonvolatile memory cell stores more than one bit of data.

16. The method of any one of claims 1–13, wherein each nonvolatile memory cell includes a floating gate.

17. An nonvolatile memory comprising:

an array of memory cells arranged in rows and columns accessible by word lines and bit lines;

a transfer transistor coupled to individual word line; and a power source coupled to a selected word line via an respective transfer transistor; and wherein said respective transfer transistor is enabled to charge interconnected gates along a row of memory cells to an operating voltage and said respective transfer transistor is disabled to hold the operating voltage dynamically at the word line.

18. The nonvolatile memory of claim 17, further comprising:

a control signal to enable or disable said transfer transistor, and said control signal further enabling said transfer transistor at predetermined times to allow coupling of said power source to refresh the voltage on the selected word line.

19. An integrated circuit with nonvolatile memory cells comprising:

means for generating from a power source an operating voltage for a memory operation;

means for connecting said power source to nonvolatile memory cells selected for said memory operation via a node of nonvolatile memory cells;

means for floating said node after it has been charged substantially to said operating voltage; and means for allowing said node to hold said operating voltage dynamically while performing said memory operation dynamically on the selected nonvolatile memory cells.

20. The integrated circuit of claim 19, further comprising:

checking at predetermined times whether the selected nonvolatile memory cells have completed said dynamic memory operation; and if the selected nonvolatile memory cells have not completed said dynamic memory operation, reconnecting said power source to refresh the voltage on said node.

21. An integrated circuit comprising:

means for connecting an operating voltage to a first portion of nonvolatile memory cells;

means for charging a node of the first portion of nonvolatile memory cells to the operating voltage;

means for floating the node of the first portion of the memory cells to hold the operating voltage dynamically; and means for operating on the first portion of nonvolatile memory cells dynamically.

22. The integrated circuit of claim 21, further comprising:

while the first portion of nonvolatile memory cells is dynamically being operated on, permitting operation on a second portion of nonvolatile memory cells.

23. The integrated circuit of any one of claims 19–22, wherein each nonvolatile memory cell stores one bit of data.

24. The integrated circuit of any one of claims 19–22, wherein each nonvolatile memory cell stores more than one bit of data.

25. The integrated circuit of any one of claims 19–22, wherein each nonvolatile memory cell includes a floating gate.

* * * * *